US 009734884B2

(12) United States Patent
Alam et al.

(10) Patent No.: US 9,734,884 B2
(45) Date of Patent: *Aug. 15, 2017

(54) METHOD FOR WRITING TO A MAGNETIC TUNNEL JUNCTION DEVICE

(71) Applicant: Everspin Technologies, Inc., Chandler, AZ (US)

(72) Inventors: Syed M. Alam, Austin, TX (US); Thomas Andre, Austin, TX (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/168,166

(22) Filed: May 30, 2016

(65) Prior Publication Data

US 2016/0276013 A1   Sep. 22, 2016

Related U.S. Application Data

(62) Division of application No. 14/580,379, filed on Dec. 23, 2014, now Pat. No. 9,378,796, which is a division of application No. 13/679,454, filed on Nov. 16, 2012, now Pat. No. 8,929,132.

(60) Provisional application No. 61/561,139, filed on Nov. 17, 2011.

(51) Int. Cl.
   *G11C 11/00*    (2006.01)
   *G11C 11/16*    (2006.01)
   *G11C 11/15*    (2006.01)

(52) U.S. Cl.
   CPC .......... *G11C 11/1675* (2013.01); *G11C 11/16* (2013.01); *G11C 11/1653* (2013.01); *G11C 11/1673* (2013.01); *G11C 11/15* (2013.01)

(58) Field of Classification Search
   CPC .......... G11C 11/16; G11C 11/15; H01L 43/08
   USPC .......................................... 365/158, 171, 48
   See application file for complete search history.

(56) References Cited

U.S. PATENT DOCUMENTS

| 5,517,448 | A | 5/1996 | Liu |
| 5,684,749 | A | 11/1997 | Seyyedy et al. |
| 6,134,141 | A | 10/2000 | Wong et al. |
| 6,363,000 | B2 | 3/2002 | Perner et al. |
| 6,483,768 | B2 | 11/2002 | Bohm et al. |
| 6,813,181 | B1 | 11/2004 | Viehmann et al. |
| 7,085,174 | B2 | 8/2006 | Hidaka |
| 7,098,481 | B2 | 8/2006 | Watanabe et al. |
| 7,782,661 | B2 * | 8/2010 | Yang ....................... G11C 11/16 365/158 |

(Continued)

FOREIGN PATENT DOCUMENTS

EP    0698889 A1    2/1996

OTHER PUBLICATIONS

Extended European Search Report in European patent application 12849762.5, mailed Jul. 2, 2015.

(Continued)

*Primary Examiner* — Connie Yoha
(74) *Attorney, Agent, or Firm* — Bookoff McAndrews, PLLC

(57) ABSTRACT

A method of applying a write current to a magnetic tunnel junction device minimizes sub-threshold leakage. NMOS- and PMOS-follower circuits are used in applying the write current, and bias signals for the follower circuits are isolated from global bias signals before the write current is applied.

20 Claims, 4 Drawing Sheets

(56) References Cited

U.S. PATENT DOCUMENTS

| | | | |
|---|---|---|---|
| 7,903,454 B2 | 3/2011 | Gogl et al. | |
| 8,929,132 B2* | 1/2015 | Alam et al. | |
| 9,336,849 B2* | 5/2016 | Alam | G11C 11/1675 |
| 9,378,796 B2 | 6/2016 | Alam et al. | |
| 2004/0042292 A1 | 3/2004 | Sakata et al. | |
| 2004/0160797 A1 | 8/2004 | Tran et al. | |
| 2007/0097730 A1* | 5/2007 | Chen | G11C 11/16 365/158 |
| 2008/0019192 A1 | 1/2008 | Wang et al. | |
| 2008/0219044 A1 | 9/2008 | Yoon et al. | |
| 2008/0310210 A1 | 12/2008 | Gogl et al. | |
| 2009/0185410 A1 | 7/2009 | Huai et al. | |
| 2010/0110775 A1 | 5/2010 | Yoon et al. | |
| 2010/0177558 A1 | 7/2010 | Sakimura et al. | |
| 2012/0081962 A1 | 4/2012 | Tsai et al. | |
| 2012/0198313 A1 | 8/2012 | Alam et al. | |
| 2013/0128657 A1 | 5/2013 | Alam | |
| 2013/0308374 A1 | 11/2013 | Gogl | |
| 2014/0226396 A1 | 8/2014 | Subramanian | |
| 2016/0093341 A1* | 3/2016 | Alam | G11C 7/062 365/63 |

OTHER PUBLICATIONS

Maffitt T. M. et al., "Design Considerations for MRAM", IBM Journal of Research and Development, Jan. 31, 2006, pp. 25-39, vol. 50, International Business Machines Corporation, New York, NY, US.

PCT International Search Report and Written Opinion, PCT/US12/65840,filed Nov. 19, 2012, mailed Jan. 29, 2013, 10 pages.

* cited by examiner

METHOD FOR WRITING TO A MAGNETIC TUNNEL JUNCTION DEVICE

This application is a divisional of U.S. application Ser. No. 14/580,379 filed Dec. 23, 2014. Application Ser. No. 14/580,379 is a divisional of U.S. application Ser. No. 13/679,454 filed Dec. 16, 2011, which issued as U.S. Pat. No. 8,929,132 on Jan. 6, 2015. This application, application Ser. No. 14/580,379, and application Ser. No. 13/679,454 all claim the benefit of U.S. Provisional Application No. 61/561,139 filed Nov. 17, 2011. The contents of application Ser. Nos. 14/580,379, 13,679,454, and 61/561,139 are incorporated by reference herein in their entirety.

TECHNICAL FIELD

The exemplary embodiments described herein generally relate to writing a spin-torque MRAM and more particularly to reducing leakage current while increasing power supply noise immunity when writing to a spin-torque MRAM.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element.

There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM (ST-MRAM), also known as spin-transfer torque RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, increasing variability in MTJ resistance and sustaining relatively high switching currents through bit cell select devices in both current directions can limit the scalability of ST-MRAM. The write current is typically higher in one direction compared to the other, so the select device must be capable of passing the larger of the two currents. In addition, ST-MRAM switching current requirements increase as the write current pulse duration is reduced. Because of this, the smallest ST-MRAM bit cell approach may require relatively long switching times.

The conventional scheme for programming spin-torque MRAM is to apply a single current or voltage pulse to the memory cells to reverse the direction of their storage layer. The duration of the pulse is set by design requirements such as memory interface specifications. Generally, the write operation has to be completed in less than 50 ns. The write voltage amplitude is set to meet the memory write error rate (WER) and lifetime requirements. It has to be greater than a certain value Vw to assure that all bits are programmed reliably, with a write error rate below a defined value $WER_0$. For megabit memories, $WER_0$ is typically less than $10^{-8}$. The write voltage amplitude also has to be low enough to assure long-term device integrity. For magnetic tunnel junctions, elevated write voltage reduces the memory lifetime because of dielectric breakdown. In some cases, it is not possible to find a write voltage that meets the desired write error rate $WER_0$ and the required lifetime. Known solutions to improve the write error rate are adding one or several layers of error correction or using multiple write pulses.

An ST-MRAM array includes a plurality of core strips, with each core strip including a bit cell array comprising a plurality of columns of bit cells (a magnetic tunnel junction and a word line select transistor). In a column of ST-MRAM bit cells, only one row is selected for writing with a positive voltage at the gate (control electrode) of the word line select transistor. However, all of the unselected word line select transistors in the column contribute to sub-threshold (off leakage) current that the write driver must provide. This sub-threshold leakage adds to the total power consumption during write operation, which may be as high as 25% of the write current when low threshold voltage word line transistors are used to maximize the write current for a given bit cell area. Accordingly, there is a need for reducing the leakage current when writing to a spin-torque MRAM.

In a column of bit cells, a first end of the magnetic tunnel junctions is connected to a first common line referred to as bit line. The second end of the magnetic tunnel junctions connect to the first current carrying electrode of their respective word line select transistor. The second current carrying electrodes of the word line select transistors are connected to a second common line referred to as source line. Due to a large number, for example 512 or 1024, of bit cells in a column, bit and source lines are long metal routes that can have significant resistance. When writing a bit far away from either the top or bottom end of a column using a write driver, current through the bit and source lines causes voltage drop reducing the applied voltage across the magnetic tunnel junction.

Accordingly, a write driver circuit is needed that minimizes voltage drop in the series resistance from the bit and source lines. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A write driver and a method is provided for writing to a spin-torque magnetoresistive random access memory (ST-MRAM).

A first exemplary embodiment is a method for writing to a spin-torque MRAM, the method comprising applying a first voltage at a bit line; and applying a second voltage at both first and second ends of a source line.

A second exemplary embodiment is a method for writing to a spin-torque MRAM, the method comprising applying a first voltage at one of a bit line or a source line with PMOS-follower circuit.

A third exemplary embodiment is a write driver coupled to a spin-torque MRAM, the write driver comprising a column of magnetic bit cells each selectively coupled between a source line and a bit line; a first MOS-follower transistor coupled to a first end of the source line; a second MOS-follower transistor coupled to a second end of the source line; a third MOS-follower transistor coupled to an end of the bit line; and a plurality of isolation transistors, one each configured to provide one of a plurality of voltages to the control electrodes of the first, second, and third MOS-follower transistors.

BRIEF DESCRIPTION OF THE DRAWINGS

The present invention will hereinafter be described in conjunction with the following drawing figures, wherein like numerals denote like elements.

DETAILED DESCRIPTION

Figure 1:
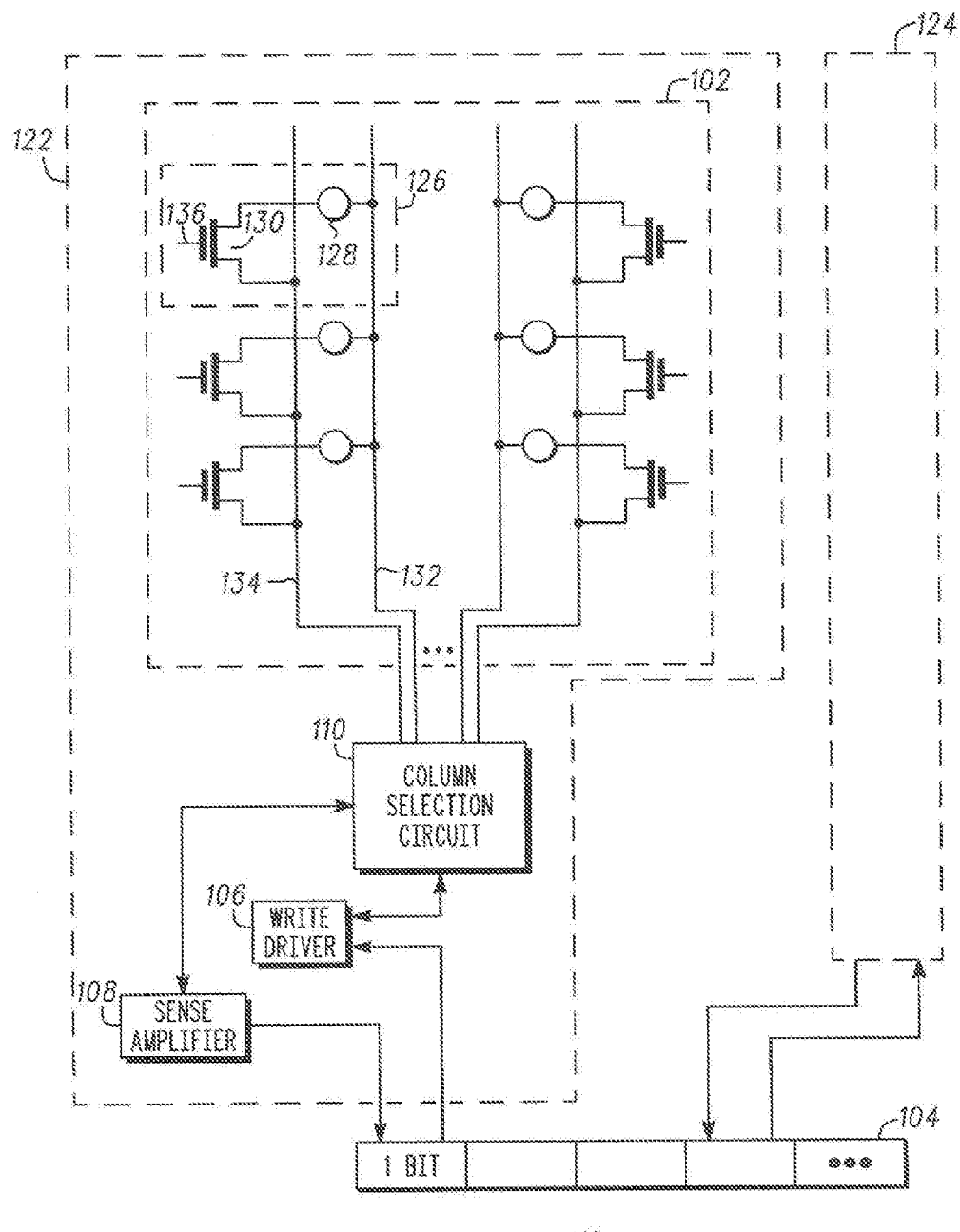
FIG. 1 is a partial circuit diagram of a known ST-MRAM.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A write driver for writing to a spin-torque magnetoresistive random access memory (ST-MRAM) minimizes sub-threshold leakage of the unselected (off) word line select transistors in the selected column. Effective metal resistance from the bit line and/or source line is reduced and power supply noise immunity is increased.

In a first exemplary embodiment of ST-MRAM, multiple portions of a column selection circuit are coupled to opposite ends of bit lines and/or source lines. Multiple portions of a write driver are coupled to the multiple portions of the column selection circuit.

In a second exemplary embodiment of the write driver, an NMOS-follower transistor applies a voltage to a selected bit line while two PMOS-follower transistors lift a selected source line above a first reference voltage, for example, ground. The gate voltage of the two PMOS-follower transistors may be negative, with the gates being capacitively coupled to a positive supply voltage of the write driver. The gate of the NMOS-follower transistor may be above the positive supply voltage, with the gate capacitively coupled to the first reference voltage. Global bias signals provide the voltage at the gates of the PMOS and NMOS follower transistors. Bias isolation transistors isolate the PMOS-follower and NMOS-follower transistor gates from their respective global bias signals during the write operation.

In a third exemplary embodiment, two NMOS-follower transistors apply a voltage to a selected source line while a PMOS-follower transistor lift a selected bit line above a first reference voltage, for example, ground. The gate voltage of PMOS-follower transistor may be negative, with the gate being capacitively coupled to a positive voltage reference. The gates of the NMOS-follower transistors may be above the positive supply voltage of the write driver, with the gate capacitively coupled to the first reference voltage. Bias isolation transistors isolate the PMOS-follower and NMOS-follower transistor gates from their respective global bias signals during the write operation. For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers are used to identify like elements according to the different figures that illustrate the various exemplary embodiments.

A magnetoresistive random access memory (MRAM) array includes write drivers and sense-amplifiers positioned near a plurality of magnetoresistive bits. A write, or program, operation begins when a current of either one of the two different and opposite polarities, set or reset, is applied through the magnetic storage element, e.g., magnetic tunnel junction (MTJ). Such write mechanism is employed in spin-transfer torque (STT) or spin torque (ST) MRAM. The spin-torque effect is known to those skilled in the art. Briefly, a current becomes spin-polarized after the electrons pass through the first magnetic layer in a magnetic/non-magnetic/magnetic tri-layer structure, where the first magnetic layer is substantially more magnetically stable than the second magnetic layer. The higher magnetic stability of the first layer compared to the second layer may be determined by one or more of several factors including: a larger magnetic moment due to thickness or magnetization, coupling to an adjacent antiferromagnetic layer, coupling to another ferromagnetic layer as in a synthetic antiferromagnetic (SAF) structure, or a high magnetic anisotropy. The spin-polarized electrons cross the nonmagnetic spacer and then, through conservation of spin angular momentum, exert a spin torque on the second magnetic layer that causes precession of its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

FIG. 1 is a partial schematic diagram of an ST-MRAM array 116. An ST-MRAM bit cell array 102 is coupled to a data storage latch 104 by a write driver 106 and a sense amplifier 108, both in series with a column selection circuit 110. The write driver 106 operates to write data from the data storage latch 104 to the array 102 and the sense amplifier 108 operates by reading data from the array 102 for storage in the data storage latch 104. The data storage latch 104 comprises multiple bits and is a part of the data path in a memory array. For simplicity and brevity, other known circuit blocks in a memory, such as a word line driver and a row and column address decode circuit, which can be coupled between the bit cell array 102 and rest of the circuits in FIG. 1, are not shown in FIG. 1.

The ST-MRAM array 116 includes a plurality of core strips 122, 124 with each core strip including a plurality of magnetic bit cells 126. Each magnetic bit cell 126 includes a magnetic tunnel junction device 128 and a word line select transistor 130. Within each core strip 122, 124 each magnetic bit 126 is coupled between a bit line 132 and a first electrode of a word line select transistor 130, while a second electrode of each word line select transistor 130 is coupled to a source line 134. A control electrode of each word line select transistor 130 is coupled to a voltage word line 136 (one of the voltage word lines 136 is coupled to a single row of word line select transistors (not shown) within each core strip 122, 124). A bit from latch 104 is coupled to the sense amplifier 108 and write driver 106. In another embodiment, a portion of latch 104 including the bit from latch 104 coupled to the core strip 122 may be located inside the core strip 122. Yet in another embodiment, sense amplifier 108 in the core strip 122 may be coupled to a different bit in latch 104 than the bit coupled to the write driver 106.

Figure 2:
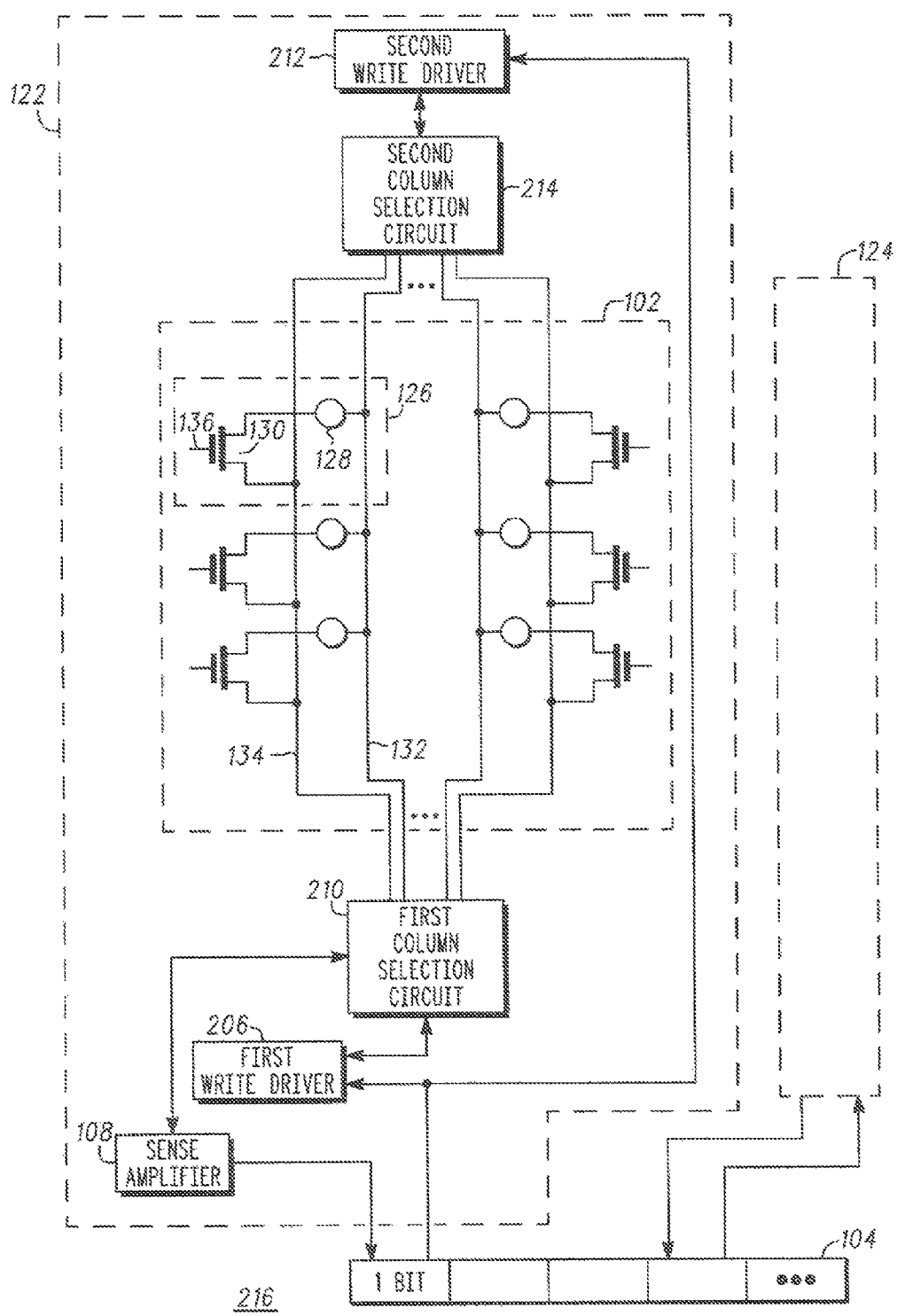
FIG. 2 is a partial circuit diagram of an ST-MRAM in accordance with a first exemplary embodiment.

FIG. 2 is a partial circuit diagram of an ST-MRAM 216 in accordance with a first exemplary embodiment. It should be noted that all components of this exemplary embodiment as illustrated in FIG. 2 that are similar to components of the exemplary embodiment of FIG. 1 are designated with like numbers. A first write driver portion 206 is coupled to one end of the bit cell array 102 through a first column selection circuit portion 210. A second write driver portion 212 is coupled to the bit cell array 102 at the opposite end through a second column selection circuit portion 214. The second write driver portion 212 is further coupled to the data storage latch 104.

Figure 3:
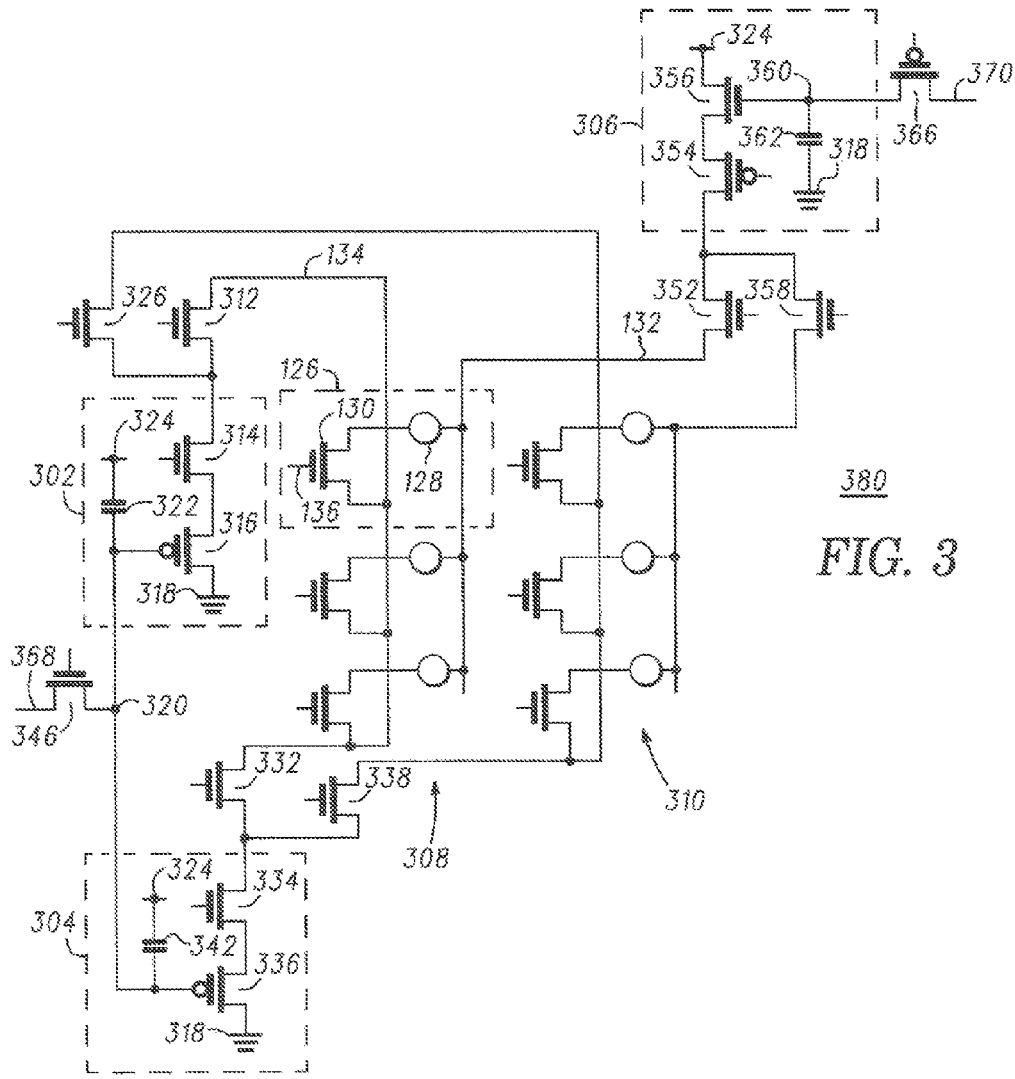
FIG. 3 is a schematic diagram of a write driver circuit coupled to ST-MRAM bit cell columns in accordance with a second exemplary embodiment.

Referring to FIG. 3, a write driver 206, 212 in accordance with a second exemplary embodiment includes a first PMOS-follower circuit 302, a second PMOS-follower circuit 304, and an NMOS-follower 306, all coupled to columns 308, 310 of bit cells 126. The selection of columns 308, 310 is made by the source line select transistors 332, 338, 312, 326, and bit line select transistors 352, and 358. The source line select transistors 332 and 338 are located in the first column selection circuit portion 210 in FIG. 2. The source line select transistors 312 and 326, and bit line select transistors 352, and 358 are located in the second column selection circuit portion 214 in FIG. 2. The second PMOS-follower circuit 304 is located in the first write driver portion 206 in FIG. 2 while the first PMOS-follower circuit 302 and the NMOS-follower circuit 306 are located in the second write driver portion 212 in FIG. 2.

The PMOS-follower circuit 302 includes a switch transistor 314 having a first current carrying electrode coupled to the source line select transistors 312 and 326, and a second current carrying electrode coupled to a first current carrying electrode of a PMOS-follower transistor 316. The switch transistor 314 has a control electrode coupled to receive an enable signal. The PMOS-follower transistor 316 has a second current carrying electrode coupled to a voltage supply 318, for example ground, and a control electrode coupled to node 320. A capacitor 322 is coupled between node 320 and a voltage supply 324. The voltage supply 318 can be a ground supply. Voltage supply 324 can be a positive voltage supply.

Likewise, the PMOS-follower circuit 304 includes a switch transistor 334 having a first current carrying electrode coupled to the source line select transistors 332 and 338, a control electrode coupled to receive an enable signal, and a second current carrying electrode coupled to a first current carrying electrode of a PMOS-follower transistor 336. The PMOS-follower transistor 336 has a second current carrying electrode coupled to the voltage supply 318, and a control electrode coupled to node 320. A capacitor 342 is coupled between the node 320 and the voltage supply 324. A bias isolation transistor 346 has a first current carrying electrode coupled to node 320, a second current carrying electrode coupled to receive a first global bias voltage on node 368, and a control electrode for receiving an isolation enable signal that when high connects node 368 to node 320 and when low isolates node 320 from node 368.

The NMOS-follower circuit 306 includes a switch transistor 354 having a first current carrying electrode coupled to the bit line select transistors 352 and 358, a control electrode coupled to receive an enable bar (active low) signal, and a second current carrying electrode coupled to a current carrying electrode of an NMOS-follower transistor 356. The NMOS-follower transistor 356 has a second current carrying electrode coupled to the voltage supply 324, and a control electrode coupled to node 360. A capacitor 362 is coupled between the node 360 and the voltage reference 318. A bias isolation transistor 366 has a first current carrying electrode coupled to node 360, a second current carrying electrode coupled to a second global bias voltage on node 370, and a control electrode coupled to receive a bias isolation bar (active low) signal that, when low, connects node 370 to node 360 and when high isolates node 360 from node 370.

In operation, when the second exemplary embodiment of write driver 206, 212 coupled to ST-MRAM bit cell columns is active (being written), one of bit cell columns 308 and 310 is selected. For example, bit cell column 308 is selected by applying a high voltage at the control electrodes of bit line select transistor 352 and source line select transistors 312 and 332. Furthermore, only one row of bit cells in bit cell columns 308 and 310 is selected by applying a high voltage at the control electrode of word line select transistor 136. The NMOS-follower transistor 356 applies a high voltage to the bit line 132 through the bit line select transistor 352 and enabled switch transistor 354. The PMOS-follower transistor 316 controls the source line 134, through the source line select transistor 312 and enabled switch transistor 314, above the voltage reference 318. Similarly, the PMOS-follower transistor 336 controls the source line 134, through the source line select transistor 332 and enabled switch transistor 334, above the voltage reference 318. The gate voltage of two PMOS-follower transistors may be negative, with the gates being capacitively coupled to a voltage reference, for example to the positive supply voltage 324. The gate of the NMOS-follower transistor may be above the positive supply voltage 324, with the gate capacitively coupled to the supply voltage 318. Bias isolation transistors isolate the NMOS-follower transistor gate node 360 from global bias node 370 and PMOS-follower transistor gates node 320 from global bias node 368 during the write operation. Alternate embodiments of capacitively coupling gate nodes 360 and 320 are possible during the write operation. For example, in one embodiment, node 360 can be capacitively coupled to node 320. Node 320 can be further coupled to the voltage supply 318. In yet another embodiment, node 360 and node 320 can be capacitively coupled with each other while node 320 is coupled to voltage supply 324. Furthermore, additional local follower circuits not shown in FIG. 3 may generate the bias voltages for nodes 320 and 360 using global bias voltages from nodes 368 and 370, respectively.

When the second exemplary embodiment of the write driver 206, 212 coupled to ST-MRAM bit cell columns is inactive, the switch transistor 354 is disabled to isolate NMOS-follower transistor 356 from rest of the circuit. Similarly, switch transistors 314 and 334 are disabled to isolate PMOS-follower transistors 316 and 336, respectively. The bias isolation switches 366 and 346 are enabled connecting node 360 to global bias node 370, and node 320 to global bias node 368, respectively.

Figure 4:
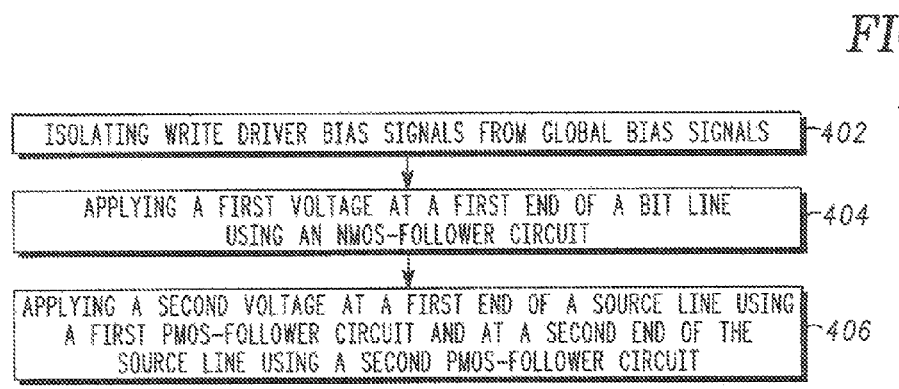
FIG. 4 is a flow chart of a method of writing an ST-MRAM in accordance with the second exemplary embodiment.

Referring to FIG. 4, a method of the second exemplary embodiment includes isolating 402 write driver bias signals from global bias signals, applying 404 a first voltage at a first end of the bit line 132 using an NMOS-follower circuit 306, and applying 406 a second voltage at both a first and second ends of a source line 134 using PMOS-follower circuits 302 and 304. The method 400 is used to apply a reset write current through the magnetic tunnel junction device 128. An alternate embodiment can apply a first voltage at a first and second ends of a bit line 132 using two NMOS-follower circuits. Another alternate embodiment can apply a first voltage at a first and second ends of a bit line 132 using two enabled PMOS transistors to the positive supply voltage 324.

Figure 5:
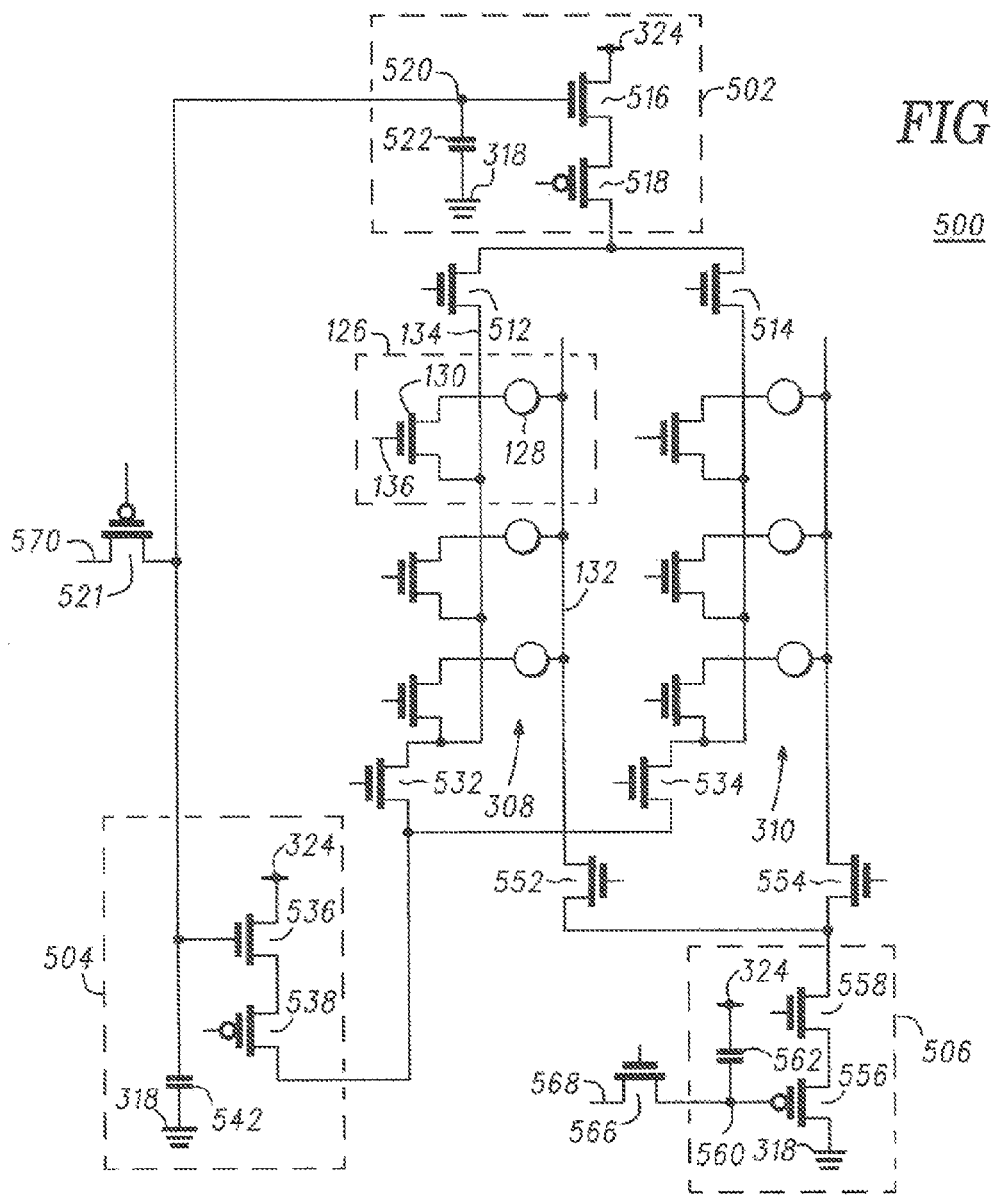
FIG. 5 is a schematic diagram of a write driver circuit coupled to ST-MRAM bit cell columns in accordance with a third exemplary embodiment.

Referring to FIG. 5, a write driver 206, 212 in accordance with a third exemplary embodiment includes a first NMOS-follower circuit 502, a second NMOS-follower circuit 504, and a PMOS-follower 506, all coupled to columns 308, 310 of bit cells 126. The selection of columns 308, 310 is made by the source line select transistors 532, 534, 512, 514, and bit line select transistors 552, and 554. The source line select transistors 532 and 534, and bit line select transistors 552 and 554 are located in the first column selection circuit portion 210 in FIG. 2. The source line select transistors 512 and 514 are located in the second column selection circuit portion 214 in FIG. 2. The second NMOS-follower circuit 504 and the PMOS-follower circuit 506 are located in the first write driver portion 206 in FIG. 2 while the first NMOS-follower circuit 502 is located in the second write driver portion 212 in FIG. 2.

The PMOS-follower circuit 506 includes a switch transistor 558 having a first current carrying electrode coupled to the bit line select transistors 552 and 554, and a second current carrying electrode coupled to a first current carrying electrode of a PMOS-follower transistor 556. The switch transistor 558 has a control electrode coupled to receive an enable signal. The PMOS-follower transistor 556 has a second current carrying electrode coupled to the voltage supply 318, for example ground, and a control electrode coupled to node 560. A capacitor 562 is coupled between node 560 and the voltage supply 324. A bias isolation transistor 566 has a first current carrying electrode coupled to node 560, a second current carrying electrode coupled to a first global bias voltage on node 568, and a control electrode coupled to receive a bias isolation signal that when high connects node 568 to node 560 and when low isolates node 568 from node 560.

The NMOS-follower circuit 504 includes a switch transistor 538 having a first current carrying electrode coupled to the source line select transistors 532 and 534, a control electrode coupled to receive an enable bar (active low) signal, and a second current carrying electrode coupled to a first current carrying electrode of an NMOS-follower transistor 536. The NMOS-follower transistor 536 has a second current carrying electrode coupled to the voltage supply 324, and a control electrode coupled to node 520. A capacitor 542 is coupled between the node 520 and the voltage supply 318. A bias isolation transistor 521 has a first current carrying electrode coupled to node 520, a second current carrying electrode coupled to receive a second global bias voltage on node 570, and a control electrode for receiving an isolation enable bar (active low) signal that when low connects node 570 to node 520 and when high isolates node 570 from node 520.

Likewise, the NMOS-follower circuit 502 includes a switch transistor 518 having a first current carrying electrode coupled to the source line select transistors 512 and 514, a control electrode coupled to receive an enable bar (active low) signal, and a second current carrying electrode coupled to a current carrying electrode of an NMOS-follower transistor 516. The NMOS-follower transistor 516 has a second current carrying electrode coupled to the voltage supply 324, and a control electrode coupled to node 520. A capacitor 522 is coupled between the node 520 and the voltage reference 318.

In operation, when the third exemplary embodiment of write driver 206, 212 coupled to ST-MRAM bit cell columns is active (being written), one of bit cell columns 308 310 is selected. For example, bit cell column 308 is selected by applying a high voltage at the control electrodes of the bit line select transistor 552 and source line select transistors 512 and 532. Furthermore, only one row of bit cells in bit cell columns 308 and 310 is selected by applying a high voltage at the control electrode of word line select transistor 136. The NMOS-follower transistor 516 applies a high voltage to the source line 134 through the source line select transistor 512 and enabled switch transistor 518. Likewise, the NMOS-follower transistor 536 applies a high voltage to the source line 134 through the source line select transistor 532 and enabled switch transistor 538. The PMOS-follower transistor 556 controls the bit line 132, through the bit line select transistor 552 and enabled switch transistor 558, above the voltage reference 318. The gate voltage of PMOS-follower transistor may be negative, with the gates being capacitively coupled to a positive voltage reference, for example to the positive supply voltage 324. The gate of the two NMOS-follower transistors may be above the positive supply voltage 324, with the gate capacitively coupled to the supply voltage 318. The bias isolation transistor 521 isolates the NMOS-follower transistors' gate node 520 from global bias node 570. The bias isolation transistor 566 isolates PMOS-follower transistor gate node 560 from global bias node 568 during the write operation. Alternate embodiments of capacitively coupling gate nodes 560 and 520 are possible during the write operation. For example, in one embodiment node 560 can be capacitively coupled to node 520. Node 520 can be further coupled to the voltage supply 318. In yet another embodiment, node 560 and node 520 can be capacitively coupled with each other while node 520 is coupled to voltage supply 324. Furthermore, additional local follower circuits not shown in FIG. 5 may generate the bias voltages for nodes 520 and 560 using global bias voltages from nodes 570 and 568, respectively.

When the third exemplary embodiment of write driver 206, 212 coupled to ST-MRAM bit cell columns is inactive, the switch transistors 518 and 538 are disabled to isolate the NMOS-follower transistors 516 and 536, respectively, from rest of the circuit. Similarly, the switch transistor 558 is disabled to isolate the PMOS-follower transistor 556. The bias isolation switches 566 and 521 are enabled connecting node 560 to global bias node 568, and node 520 to global bias node 570, respectively.

A method in accordance with the third exemplary embodiment (see FIG. 6) includes isolating 602 write driver bias signals from global bias signals, applying 604 a third voltage at first and second ends of the source line 134 using NMOS-follower circuits 502 and 504, respectively, and applying 606 a fourth voltage at one end of the bit line 132 using a PMOS-follower circuit 506. The method 600 is used to apply a set write current through the magnetic tunnel junction device 128. An alternate embodiment can apply a fourth voltage at a first and second ends of a bit line 132 using two PMOS-follower circuits. Another alternate embodiment can apply a third voltage at a first and second ends of a source line 134 using two enabled PMOS transistors to the positive supply voltage 324.

Figure 6:
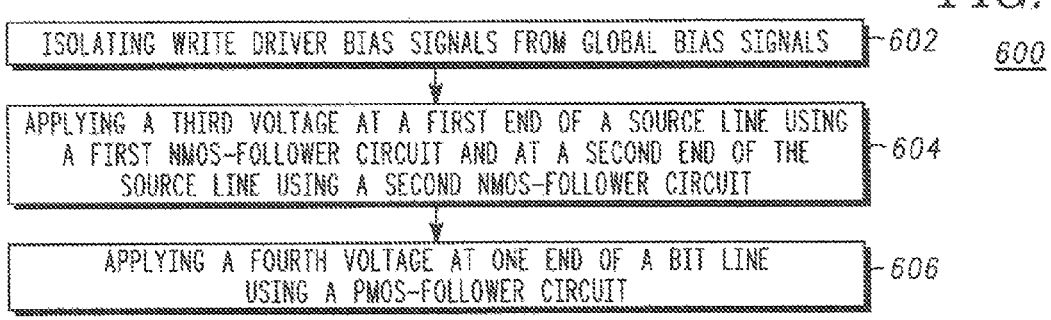
FIG. 6 is a flow chart of a method of writing an ST-MRAM in accordance with the third exemplary embodiment.

FIGS. 4 and 6 are flow charts that illustrate exemplary embodiments of methods of writing to a spin-torque MRAM. The various tasks performed in connection with methods 400, 600 may be performed by hardware, firmware, or any combination thereof. For illustrative purposes, the description of methods 400, 600 refer to elements mentioned above in connection with FIGS. 3 and 5. It should be appreciated that methods 400, 600 may include any number of additional or alternative tasks, the tasks shown in FIGS. 4 and 6 need not be performed in the illustrated order, and methods 400, 600 may be incorporated into a more comprehensive procedure or method having additional functionality not described in detail herein. Moreover, one or more of the tasks shown in FIGS. 4 and 6 could be omitted from an embodiment of the methods 400, 600 as long as the intended overall functionality remains intact.

In summary, a write driver for writing to a spin-torque magnetoresistive random access memory (ST-MRAM) minimizes sub-threshold leakage of the unselected (off) word line select transistors in the selected column. Effective metal resistance in the bit line and/or source line is reduced by driving a line from two ends and power supply noise immunity is increased by utilizing NMOS-follower and PMOS-follower circuits. The exemplary methods described herein include isolating write driver bias signals from global bias signals; applying a first voltage at one end of a bit line using one of a first NMOS-follower circuit or a first PMOS-follower circuit; and when using the first NMOS-follower circuit, applying a second voltage at a first end of a source line using a second PMOS-follower circuit and at a second end of the source line using a third PMOS-follower circuit, or when using the first PMOS-follower circuit, applying the second voltage at the first end of the source line using a second NMOS-follower circuit and at a second end of the source line using a third NMOS-follower circuit.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A magnetic random access memory, comprising:
  a bit cell that includes:
    a magnetic tunnel junction device;
    a select transistor coupled to the magnetic tunnel junction device, wherein a first end of the magnetic tunnel junction device is coupled to a first electrode of the select transistor;

a first switch transistor coupled to a first end of the bit cell;
a first MOS-follower transistor configured to apply a first voltage to the first end of the bit cell, wherein the first switch transistor is coupled between the first MOS-follower transistor and the first end of the bit cell;
a word line coupled to a control electrode of the select transistor of the bit cell; and
a word line driver coupled to the word line, the word line driver configured to drive the word line to a high voltage to apply the high voltage at the control electrode of the select transistor.

2. The memory of claim 1, wherein the first MOS-follower transistor is an NMOS-follower transistor.

3. The memory of claim 1 further comprising a first common line coupled between the first end of the bit cell and the first switch transistor.

4. The memory of claim 3, wherein the first common line is a bit line, and wherein the memory further comprises a bit line select transistor coupled between the bit line and the first switch transistor.

5. The memory of claim 3, wherein the first common line is a source line, and wherein the memory further comprises a source line select transistor coupled between the source line and the first switch transistor.

6. The memory of claim 1 further comprising a second MOS-follower transistor coupled to a second end of the bit cell, the second MOS-follower transistor configured to apply a second voltage to the second end of the bit cell.

7. The memory of claim 6, wherein the first MOS-follower transistor is an NMOS-follower transistor, wherein the second MOS-follower transistor is a PMOS-follower transistor, and wherein the first voltage is a higher voltage than the second voltage.

8. A magnetic random access memory, comprising:
a bit cell that includes:
a magnetic tunnel junction device;
a select transistor coupled to the magnetic tunnel junction device, wherein a first end of the magnetic tunnel junction device is coupled to a first electrode of the select transistor;
a first MOS-follower transistor coupled to a first end of the bit cell, the first MOS-follower transistor configured to apply a first voltage to the first end of the bit cell;
a word line coupled to a control electrode of the select transistor of the bit cell;
a word line driver coupled to the word line, the word line driver configured to drive the word line to a high voltage to apply the high voltage at the control electrode of the select transistor;
a bias isolation transistor that includes:
a first electrode coupled to a control electrode of the first MOS-follower transistor; and
a second electrode coupled to a bias voltage; and
a control electrode configured to receive a bias isolation signal, wherein, when the bias isolation signal is asserted, the bias isolation transistor connects the control electrode of the first MOS-follower transistor to the bias voltage, and wherein, when the bias isolation signal is de-asserted, the bias isolation transistor isolates the control electrode of the first MOS-follower transistor from the bias voltage.

9. The memory of claim 8 further comprising a capacitor coupled to the control electrode of the first MOS-follower transistor.

10. The memory of claim 8, wherein the first MOS-follower transistor is an NMOS-follower transistor.

11. A magnetic random access memory, comprising:
a bit cell that includes:
a magnetic tunnel junction device;
a select transistor coupled to the magnetic tunnel junction device, wherein a first end of the magnetic tunnel junction device is coupled to a first electrode of the select transistor;
a first MOS-follower circuit coupled to a first end of the bit cell, the first MOS-follower circuit configured to apply a first voltage to the first end of the bit cell, the first MOS-follower circuit including:
a MOS-follower transistor having a control electrode coupled to a node;
a bias isolation transistor having:
a first electrode coupled to the node; and
a second electrode coupled to a bias voltage; and
a switch transistor coupled between the MOS-follower transistor and the first end of the bit cell;
a word line coupled to a control electrode of the select transistor of the bit cell; and
a word line driver coupled to the word line, the word line driver configured to drive the word line to a high voltage to apply the high voltage at the control electrode of the select transistor.

12. The memory of claim 11, wherein the MOS-follower transistor is an NMOS-follower transistor.

13. The memory of claim 11 further comprising a second MOS-follower circuit coupled to a second end of the bit cell, the second MOS-follower circuit configured to apply a second voltage to the second end of the bit cell.

14. The memory of claim 13, wherein the first MOS-follower circuit is an NMOS-follower circuit, wherein the second MOS-follower circuit is a PMOS-follower circuit, and wherein the first voltage is a higher voltage than the second voltage.

15. The memory of claim 11 further comprising a capacitor coupled to the node.

16. The memory of claim 11 further comprising a bit line select transistor coupled between the switch transistor of the MOS-follower circuit and the first end of the bit cell.

17. A method of applying a write current through a bit cell, wherein the bit cell includes a magnetic tunnel junction device coupled to a select transistor, the method comprising:
providing a bias signal to a control electrode of a first MOS-follower transistor included in a first MOS-follower circuit, the first MOS-follower circuit including a first switch transistor coupled in series with the first MOS-follower transistor;
applying a first voltage to a control electrode of the select transistor to select the magnetic tunnel junction device in the bit cell;
isolating the bias signal from the control electrode of the first MOS-follower transistor; and
after isolating the bias signal from the control electrode of the first MOS-follower transistor, applying a second voltage to a first end of the bit cell using the first MOS-follower circuit.

18. The method of claim 17, wherein the first MOS-follower circuit includes a first capacitor coupled between the control electrode of the first MOS-follower transistor and a first voltage supply, wherein isolating the bias signal further comprises using a first bias isolation transistor to isolate the control electrode of the first MOS-follower transistor from a bias node.

19. The method of claim 17 further comprises:
after applying the second voltage to the first end of the bit cell, applying a third voltage to the second end of the bit cell using a second MOS-follower circuit.

20. The method of claim 17, wherein the first MOS-follower transistor is an NMOS-follower transistor, and wherein applying the second voltage to the first end of the bit cell includes applying the second voltage using the NMOS-follower transistor.

* * * * *